(12) United States Patent
Tsukihara et al.

(10) Patent No.: US 11,554,421 B2
(45) Date of Patent: Jan. 17, 2023

(54) CUTTING TOOL AND METHOD OF MANUFACTURING THE SAME

(71) Applicant: SUMITOMO ELECTRIC HARDMETAL CORP., Itami (JP)

(72) Inventors: Nozomi Tsukihara, Itami (JP); Katsuo Kazahaya, Itami (JP); Yutaka Kobayashi, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 236 days.

(21) Appl. No.: 16/639,866

(22) PCT Filed: May 15, 2018

(86) PCT No.: PCT/JP2018/018739
§ 371 (c)(1),
(2) Date: Feb. 18, 2020

(87) PCT Pub. No.: WO2019/039005
PCT Pub. Date: Feb. 28, 2019

(65) Prior Publication Data
US 2020/0361005 A1    Nov. 19, 2020

(30) Foreign Application Priority Data

Aug. 22, 2017  (JP) .............................. JP2017-159279

(51) Int. Cl.
*B23B 27/20*  (2006.01)
*B23C 5/10*  (2006.01)
(Continued)

(52) U.S. Cl.
CPC ................ *B23B 27/20* (2013.01); *B23C 5/10* (2013.01); *B23C 5/16* (2013.01)

(58) Field of Classification Search
CPC .......... B23B 2228/04; B23B 2226/315; B23B 2228/105; B23B 27/005; B23B 27/20;
(Continued)

(56) References Cited

U.S. PATENT DOCUMENTS

2006/0216515 A1    9/2006  Kazahaya et al.
2009/0245948 A1   10/2009  Motomura
(Continued)

FOREIGN PATENT DOCUMENTS

JP    2007-307673 A    11/2007
JP    2011-101910 A     5/2011
(Continued)

*Primary Examiner* — Sara Addisu
(74) *Attorney, Agent, or Firm* — Faegre Drinker Biddle & Reath LLP

(57) ABSTRACT

A cutting tool includes a substrate and a diamond layer that covers the substrate. The diamond layer includes a rake face and a flank continuous to the rake face. A ridgeline between the rake face and the flank forms a cutting edge. The substrate includes a top surface opposed to the rake face. When viewed in a direction perpendicular to the top surface, the rake face includes a plurality of protrusions. In a cross-section perpendicular to a direction of extension of the cutting edge, each of the plurality of protrusions includes an inclined portion and a curvature portion continuous to the inclined portion. In the cross-section, a height of the inclined portion in the direction perpendicular to the top surface increases as a distance from the cutting edge increases.

5 Claims, 8 Drawing Sheets

(51) Int. Cl.
*B23B 27/14* (2006.01)
*B23C 5/16* (2006.01)
(58) Field of Classification Search
CPC ............ B23C 2228/04; B23C 2228/10; B23C 2226/315; B23C 5/10; B23C 5/16; B29P 15/34; C23C 30/005
See application file for complete search history.

(56) References Cited

U.S. PATENT DOCUMENTS

2014/0338512 A1* 11/2014 Suzuki .................... B23B 27/14
83/651
2015/0117972 A1 4/2015 Osaki et al.

FOREIGN PATENT DOCUMENTS

| JP | 2014-226733 A | 12/2014 |
| JP | 2015-085462 A | 5/2015 |
| WO | WO-2005/011902 A1 | 2/2005 |

\* cited by examiner

CUTTING TOOL AND METHOD OF MANUFACTURING THE SAME

TECHNICAL FIELD

The present invention relates to a cutting tool. The present application claims priority to Japanese Patent Application No. 2017-159279 filed on Aug. 22, 2017, the entire contents of which are herein incorporated by reference.

BACKGROUND ART

Japanese Patent Laying-Open No. 2011-101910 describes a diamond-coated cutting tool including a substrate and a diamond layer that covers a surface of the substrate. A surface of the diamond layer at a cutting edge of the diamond-coated cutting tool has arithmetic mean roughness not smaller than 0.1 µm and not greater than 5 µm. At the cutting edge, an average thickness of the diamond layer on a flank is larger than an average thickness of the diamond layer on a rake face.

CITATION LIST

Patent Literature

PTL 1: Japanese Patent Laying-Open No. 2011-101910

SUMMARY OF INVENTION

A cutting tool according to one manner of the present invention includes a substrate and a diamond layer that covers the substrate. The diamond layer includes a rake face and a flank continuous to the rake face. A ridgeline between the rake face and the flank forms a cutting edge. The substrate includes a top surface opposed to the rake face. When viewed in a direction perpendicular to the top surface, the rake face includes a plurality of protrusions. In a cross-section perpendicular to a direction of extension of the cutting edge, each of the plurality of protrusions includes an inclined portion and a curvature portion continuous to the inclined portion. In the cross-section, a height of the inclined portion in the direction perpendicular to the top surface increases as a distance from the cutting edge increases.

DETAILED DESCRIPTION

Figure 1:
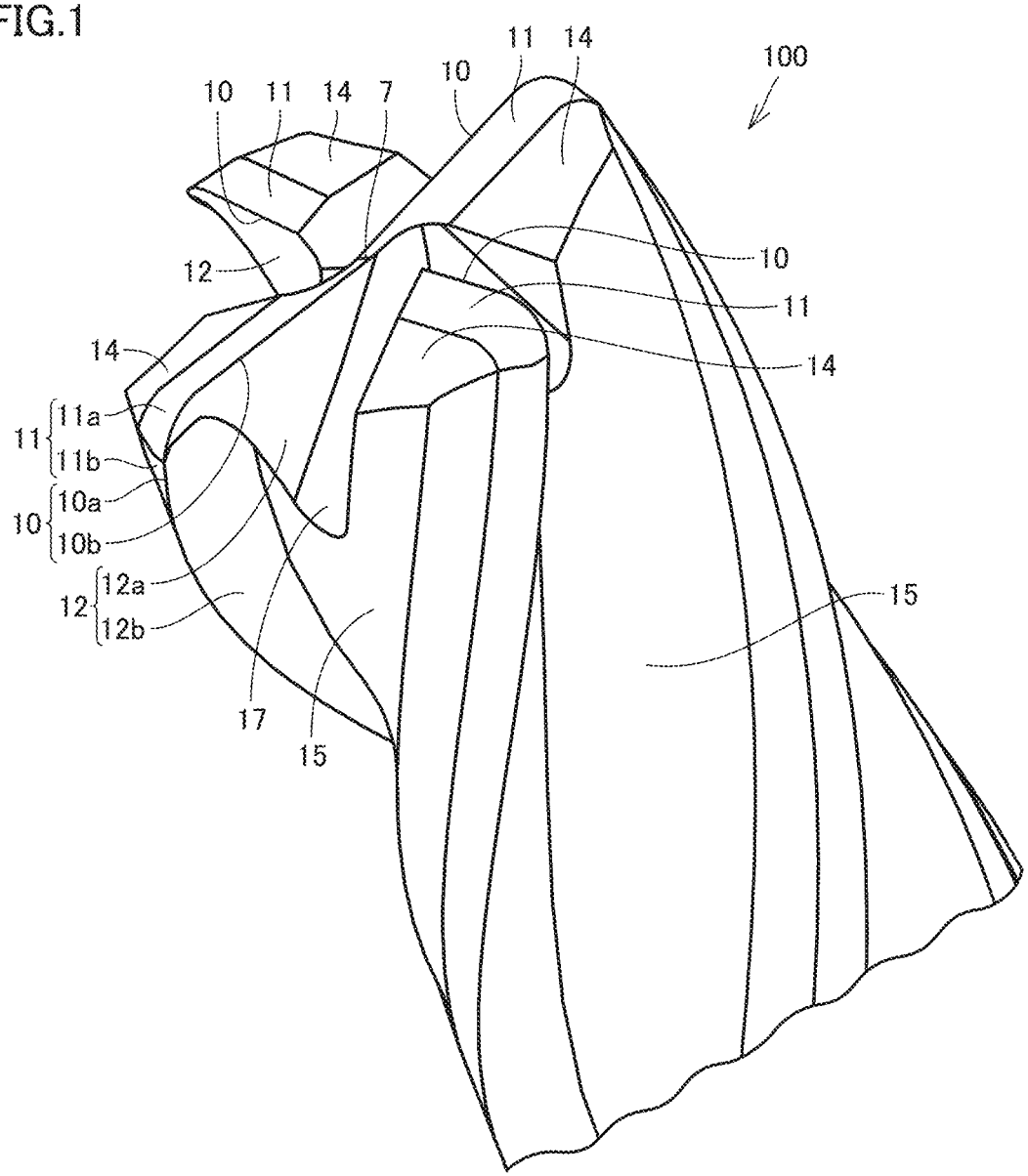
FIG. 1 is a schematic perspective view showing a construction of a cutting tool according to a first embodiment.

Problem to be Solved by the Present Disclosure

The diamond-coated cutting tool according to the background art is disadvantageous in its short tool lifetime.

One manner of the present invention was made to solve the problem as above, and an object thereof is to provide a cutting tool capable of achieving an improved tool lifetime.

Advantageous Effect of the Present Disclosure

According to one manner of the present invention, a cutting tool capable of achieving an improved tool lifetime can be provided.

Overview of Embodiments of the Present Invention

Overview of embodiments of the present invention will initially be described.

(1) A cutting tool 100 according to one manner of the present invention includes a substrate 20 and a diamond layer 7 that covers substrate 20. Diamond layer 7 includes a rake face 12 and a flank 11 continuous to rake face 12. A ridgeline between rake face 12 and flank 11 forms a cutting edge 10. Substrate 20 includes a top surface 22 opposed to rake face 12. When viewed in a direction perpendicular to top surface 22, rake face 12 includes a plurality of protrusions 1. In a cross-section perpendicular to a direction of extension B of cutting edge 10, each of the plurality of protrusions 1 includes an inclined portion 2 and a curvature portion 3 continuous to inclined portion 2. In the cross-section, a height of inclined portion 2 in the direction perpendicular to top surface 22 increases as a distance from cutting edge 10 increases.

According to cutting tool 100 in (1), each of the plurality of protrusions 1 includes inclined portion 2 increasing in its height in the direction perpendicular to top surface 22 as a distance from cutting edge 10 increases. Therefore, chips can smoothly pass over inclined portion 2 of rake face 12. Consequently, ejectability of chips is improved. Therefore, damage to the cutting tool is lessened and a tool lifetime can be improved.

(2) In cutting tool 100 according to (1), when viewed in the direction perpendicular to top surface 22, an angle θ formed between a straight line D2 resulting from projection of a normal D3 to inclined portion 2 onto top surface 22 and a normal D1 to cutting edge 10 in a direction in parallel to top surface 22 may be not greater than 80°. A direction of ejection of chips can thus substantially be in parallel to the direction of the straight line resulting from projection of the normal to the inclined portion onto the top surface. Consequently, ejectability of chips is further improved.

(3) In cutting tool 100 according to (1) or (2), when viewed in the direction perpendicular to top surface 22, the plurality of protrusions 1 may be provided over an area within 2 mm from cutting edge 10. Chips are thus readily ejected in a most part of the area where chips pass.

(4) In cutting tool 100 according to any of (1) to (3), in the cross-section, cutting edge 10 may have a radius of curvature not smaller than 0.01 μm and not greater than 50 μm. Sharpness can thus be improved.

(5) A method of manufacturing cutting tool 100 according to one embodiment of the present invention includes steps below. Substrate 20 is covered with diamond layer 7. A part of diamond layer 7 is removed by ion beams. Cutting tool 100 includes rake face 12 and flank 11 continuous to rake face 12. Substrate 20 includes top surface 22 opposed to rake face 12 and a side surface 21 opposed to flank 11. In the covering substrate 20 with diamond layer 7, a surface of diamond layer 7 is formed with a plurality of protrusions 8. In the removing a part of diamond layer 7, a part of each of the plurality of protrusions 8 is removed by emission of ion beams from upper left in a direction inclined with respect to top surface 22, with top surface 22 facing up and a ridgeline 23 between top surface 22 and side surface 21 facing to the left.

According to the method of manufacturing cutting tool 100 in (5), a part of each of the plurality of protrusions 8 is removed by emission of ion beams from upper left in the direction inclined with respect to top surface 22 with top surface 22 facing up and ridgeline 23 between top surface 22 and side surface 21 facing to the left. A plurality of protrusions 1 can thus be formed. Each of the plurality of protrusions 1 includes inclined portion 2 increasing in its height in the direction perpendicular to top surface 22 as a distance from cutting edge 10 increases. Therefore, chips can smoothly pass over inclined portion 2 of rake face 12. Consequently, ejectability of chips is improved. Therefore, damage to the cutting tool is lessened and a tool lifetime is extended.

(6) In the method of manufacturing cutting tool 100 according to (5), the removing a part of diamond layer 7 may be performed without turning substrate 20. The plurality of protrusions 1 can thus be formed with a simplified method.

Details of Embodiments of the Present Invention

Details of embodiments of the present invention will be described below with reference to the drawings. The same or corresponding elements in the drawings below have the same reference characters allotted and description thereof will not be repeated. At least a part of the embodiments described below may optionally be combined.

First Embodiment

Figure 2:
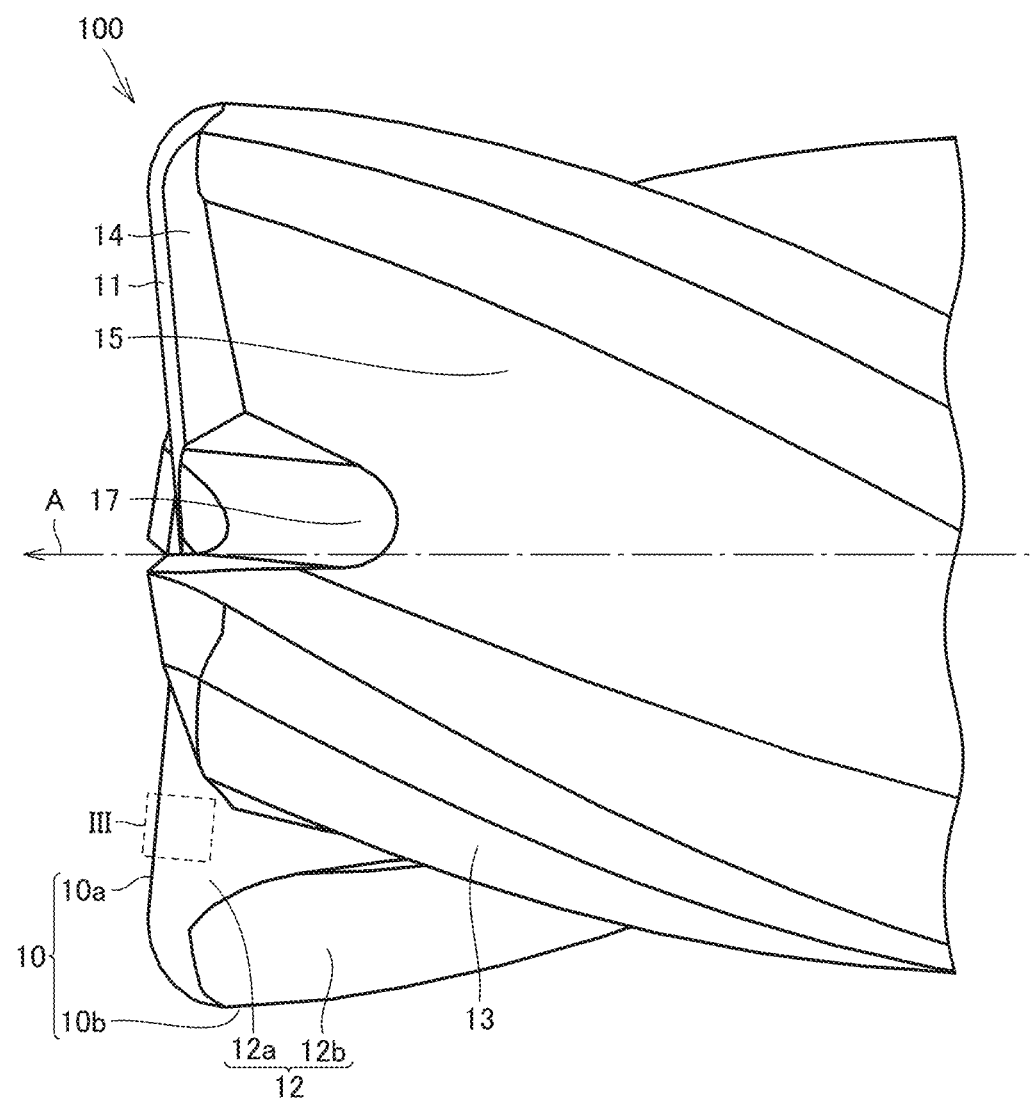
FIG. 2 is a schematic front view showing the construction of the cutting tool according to the first embodiment.

A construction of cutting tool 100 according to a first embodiment will initially be described. FIG. 1 is a schematic perspective view showing a construction of the cutting tool according to the first embodiment. FIG. 2 is a schematic front view showing the construction of the cutting tool according to the first embodiment.

As shown in FIGS. 1 and 2, cutting tool 100 according to the first embodiment is a radius end mill used, for example, for working carbon fiber reinforced plastic (CFRP). Cutting tool 100 is revolvable, for example, around a central axis A.

Cutting tool 100 mainly includes rake face 12, flank 11, a heel face 14, a first flute face 15, and a second flute face 17. Flank 11 is continuous to rake face 12. Heel face 14 is continuous to flank 11. Heel face 14 is located in the rear of flank 11 in a direction of revolution. A ridgeline between rake face 12 and flank 11 forms cutting edge 10.

As shown in FIGS. 1 and 2, cutting edge 10 may include an end cutting edge 10a and a peripheral cutting edge 10b. Peripheral cutting edge 10b is located on an outer peripheral side relative to end cutting edge 10a. Flank 11 may include a first flank portion 11a and a second flank portion 11b. Rake face 12 may include a first rake face portion 12a and a second rake face portion 12b. A ridgeline between first flank portion 11a and first rake face portion 12a may form end cutting edge 10a. A ridgeline between second flank portion 11b and second rake face portion 12b may form peripheral cutting edge 10b. First flute face 15 may be continuous to second flute face 17. First flute face 15 may be located on the outer peripheral side relative to second flute face 17. Second flute face 17 may be continuous to first rake face portion 12a. Heel face 14 may be located closer to a shank 19 than flank 11.

Figure 3:
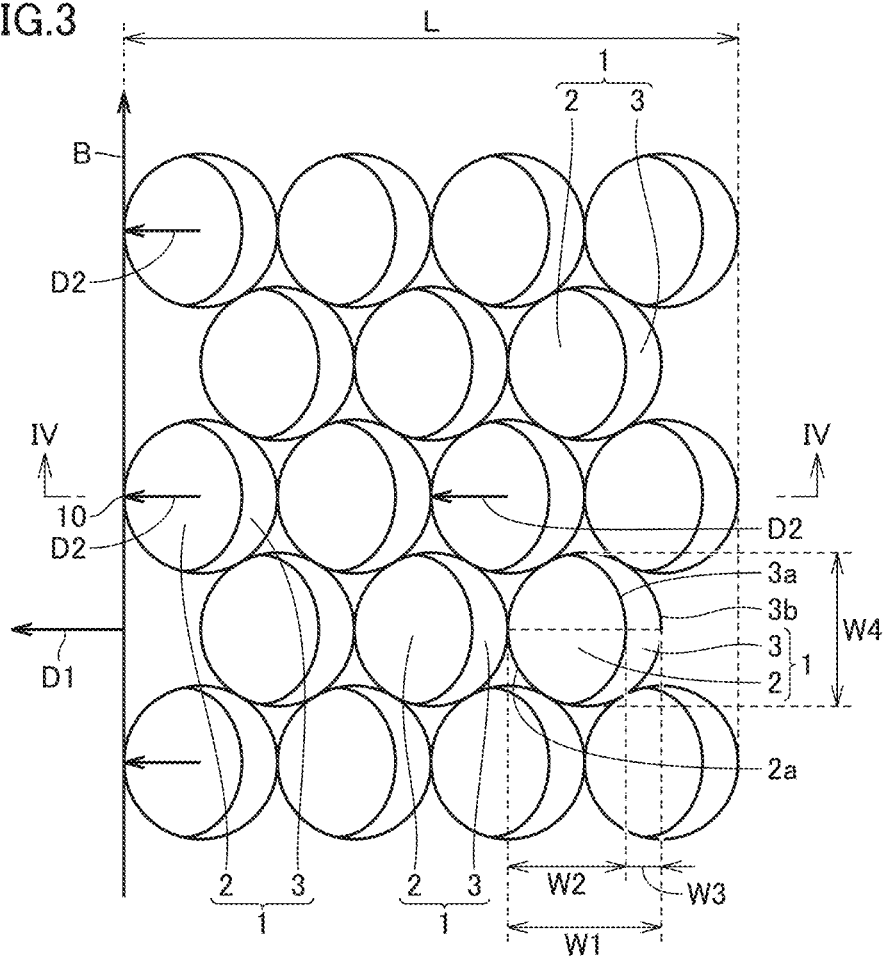
FIG. 3 is an enlarged schematic diagram of a region III in FIG. 2.
Figure 4:
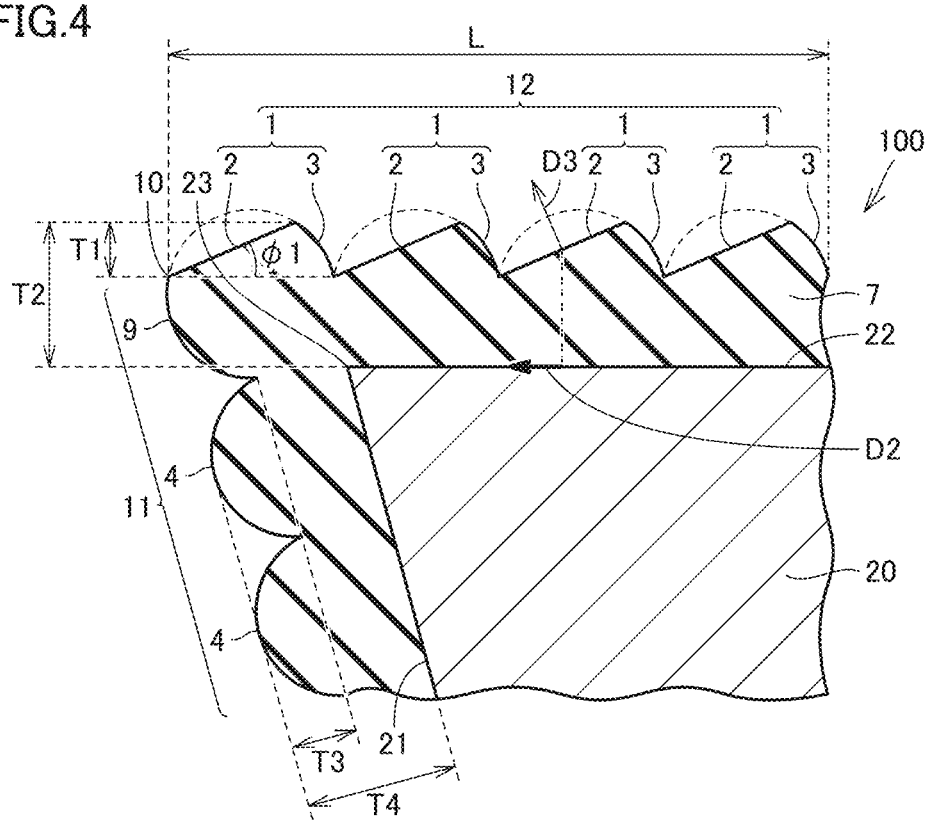
FIG. 4 is a schematic cross-sectional view along the line IV-IV in FIG. 3.

FIG. 3 is an enlarged schematic diagram of a region III in FIG. 2. FIG. 4 is a schematic cross-sectional view along the line IV-IV in FIG. 3. As shown in FIG. 4, cutting tool 100 mainly includes substrate 20 and diamond layer 7. Diamond layer 7 covers substrate 20. Diamond layer 7 includes rake face 12 and flank 11. In other words, each of rake face 12 and flank 11 is formed from diamond layer 7.

Substrate 20 mainly includes top surface 22 and side surface 21. Top surface 22 is opposed to rake face 12. Side surface 21 is opposed to flank 11. Substrate 20 is made, for example, of cemented carbide containing powders of tungsten carbide (WC) and a binder such as cobalt (Co). Substrate 20 is not limited to a substrate composed of cemented carbide but may be composed, for example, of cermet or ceramics. Diamond layer 7 contains, for example, diamond crystals. Diamond layer 7 may be composed, for example, of polycrystalline diamond.

As shown in FIG. 3, when viewed in the direction perpendicular to top surface 22, rake face 12 includes a plurality of first protrusions 1. The plurality of first protrusions 1 may be aligned along a direction perpendicular to direction of extension B of cutting edge 10. Similarly, the plurality of first protrusions 1 may be aligned along direction of extension B of cutting edge 10. The plurality of first protrusions 1 may be in contact with one another. A large number of first protrusions 1 may be provided. The large number means, for example, ten or more within a range of 20 μm square.

As shown in FIG. 4, in a cross-section perpendicular to direction of extension B of cutting edge 10, each of the plurality of first protrusions 1 includes first inclined portion 2 and first curvature portion 3. First curvature portion 3 is continuous to first inclined portion 2. Each of the plurality of first protrusions 1 is constituted of first inclined portion 2 and first curvature portion 3. First curvature portion 3 is located opposite to cutting edge 10 with respect to first inclined portion 2. Each of the plurality of first protrusions 1 protrudes in a direction away from substrate 20. In the cross-section, a height of first inclined portion 2 in the direction perpendicular to top surface 22 increases as a distance from cutting edge 10 increases. The height of first inclined portion 2 may monotonously increase as the distance from cutting edge 10 increases. When arrangement is such that top surface 22 faces up and ridgeline 23 between top surface 22 and side surface 21 faces to the left, first inclined portion 2 extends from lower left toward upper right.

First inclined portion 2 is inclined with respect to top surface 22. An angle φ1 of first inclined portion 2 with respect to top surface 22 is, for example, not smaller than 10° and not greater than 40°. An upper limit of angle φ1 is not particularly limited and it may be set, for example, to 80° or 30°. A lower limit of angle φ1 is not particularly limited and it may be set, for example, to 5° or 1°. As shown in FIG. 3, when viewed in the direction perpendicular to top surface 22, straight line D2 resulting from projection of normal D3 (see FIG. 4) to first inclined portion 2 onto top surface 22 and normal D1 to cutting edge 10 in the direction in parallel to top surface 22 may be substantially in parallel to each other. Among the plurality of first protrusions 1, straight lines D2 resulting from projection of normal D3 to inclined portion 2 onto top surface 22 may be in parallel to one another or intersect with one another.

As shown in FIG. 4, in the direction perpendicular to top surface 22, a portion of diamond layer 7 in contact with top surface 22 has a thickness T2, for example, of 10 μm. The portion of diamond layer 7 in contact with top surface 22 has thickness T2, for example, not smaller than 5 μm and not greater than 20 μm. In the direction perpendicular to top surface 22, each of the plurality of first protrusions 1 has a thickness T1, for example, of 3μm. Each of the plurality of first protrusions 1 has thickness T1, for example, not smaller than 1μm and not greater than 5 μm.

As shown in FIG. 3, when viewed in the direction perpendicular to top surface 22, first curvature portion 3 is in a shape, for example, like a crescent. First curvature portion 3 includes a boundary portion 3a between the first curvature portion and first inclined portion 2 and a first outer peripheral portion 3b opposite to boundary portion 3a. When viewed in the direction perpendicular to top surface 22, each of boundary portion 3a and first outer peripheral portion 3b is curved as protruding away from cutting edge 10. Each of boundary portion 3a and first outer peripheral portion 3b may be arcuate. Boundary portion 3a may be greater in radius of curvature than first outer peripheral portion 3b.

First inclined portion 2 includes a second outer peripheral portion 2a opposite to boundary portion 3a. When viewed in the direction perpendicular to top surface 22, second outer peripheral portion 2a is curved as protruding toward cutting edge 10. A width W4 of first inclined portion 2 in direction of extension B of cutting edge 10 may be greater than a width W2 of first inclined portion 2 in the direction perpendicular to direction of extension B of cutting edge 10 and in parallel to top surface 22. In the direction perpendicular to direction of extension B of cutting edge 10 and in parallel to top surface 22, width W2 of first inclined portion 2 may be greater than a width W3 of first curvature portion 3. In direction of extension B of cutting edge 10, width W4 of first inclined portion 2 may be substantially equal to the width of first curvature portion 3. Width W4 of first inclined portion 2 in direction of extension B of cutting edge 10 may substantially be equal to a width W1 of first protrusion 1 in the direction perpendicular to direction of extension B of cutting edge 10 and in parallel to top surface 22.

As shown in FIG. 3, when viewed in the direction perpendicular to top surface 22, each of the plurality of first protrusions 1 may be in a shape like a scale. Such an appearance that a large number of protrusions each including an inclined portion and a curvature portion are provided at a density high to some extent with orientations of the inclined portions being substantially aligned to cast crescent-shaped shade in a portion corresponding to the curvature portion to look like scales of a fish in a two-dimensional scanning electron microscope (SEM) image is herein referred to an appearance like scales. As shown in FIG. 3, when viewed in the direction perpendicular to top surface 22, the plurality of first protrusions 1 may be provided over an area within a distance L from cutting edge 10. Distance L is set, for example, to 2 mm. Distance L is not particularly limited and it may be set to 10 μm or 500 μm. In other words, the plurality of first protrusions 1 are formed in an area of rake face 12 lying between cutting edge 10 and a position at distance L from cutting edge 10 in the direction perpendicular to direction of extension B of cutting edge 10. Distance L may be, for example, approximately as long as a depth of cut. When cutting edge 10 is curved not linear, the direction perpendicular to direction of extension B of cutting edge 10 means a direction perpendicular to a tangential line of cutting edge 10.

As shown in FIG. 4, cutting edge 10 may be defined by a boundary between first inclined portion 2 of rake face 12 and a curvature portion 9 of flank 11. Cutting edge 10 is formed as being sharply pointed. Specifically, in the cross-section perpendicular to direction of extension B of cutting edge 10, cutting edge 10 has a radius of curvature, for example, not smaller than 0.01 μm and not greater than 50 μm. An upper limit of the radius of curvature of cutting edge 10 is not particularly limited and it may be set, for example, to 30 μm or 10 μm. A lower limit of the radius of curvature of cutting edge 10 is not particularly limited and it may be set, for example, to 1 μm or 0.1 μm.

As shown in FIG. 4, flank 11 may include a plurality of second protrusions 4. In the cross-section perpendicular to direction of extension B of cutting edge 10, each of the plurality of second protrusions 4 may include an arcuate portion. The plurality of second protrusions 4 may be clustered. A thickness T4 of the portion of diamond layer 7 in contact with side surface 21 in a direction perpendicular to side surface 21 may be greater than thickness T2 of the portion of diamond layer 7 in contact with top surface 22 in the direction perpendicular to top surface 22. A thickness T3 of second protrusion 4 in the direction perpendicular to side surface 21 may be greater than thickness T1 of each of the plurality of first protrusions 1 in the direction perpendicular to top surface 22.

Figure 5:
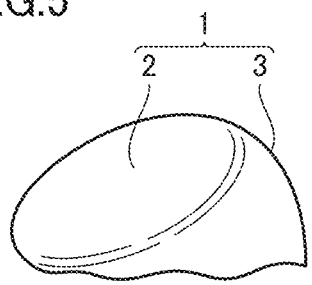
FIG. 5 is a schematic perspective view showing a construction of a first protrusion 1 of the cutting tool according to the first embodiment.

FIG. 5 is a schematic perspective view showing a construction of first protrusion 1 of the cutting tool according to the first embodiment. As shown in FIG. 5, each of the plurality of first protrusions 1 may be, for example, in such a shape that a part of a hemisphere is cut and removed by a plane intersecting with the hemisphere. Specifically, each of the plurality of first protrusions 1 may be constituted of substantially planar first inclined portion 2 and substantially spherical first curvature portion 3. First inclined portion 2 may convexly be curved.

A method of manufacturing a cutting tool according to the first embodiment will now be described.

Figure 6:
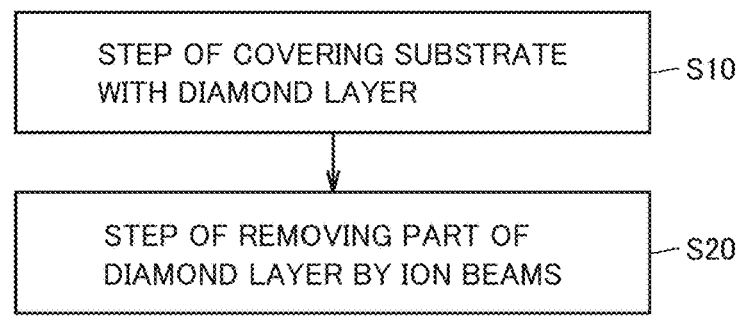
FIG. 6 is a flowchart schematically showing a method of manufacturing a cutting tool according to the first embodiment.

FIG. 6 is a flowchart schematically showing a method of manufacturing a cutting tool according to the first embodiment. The method of manufacturing a cutting tool according to the first embodiment mainly includes steps of covering the substrate with the diamond layer (S10: FIG. 6) and removing a part of the diamond layer by ion beams (S20: FIG. 6).

Figure 7:
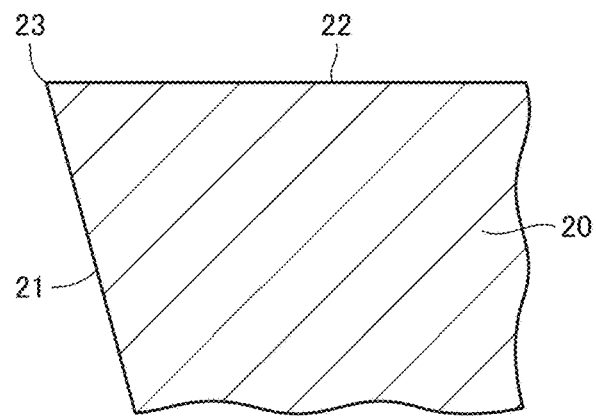
FIG. 7 is a schematic cross-sectional view showing a first step in the method of manufacturing a cutting tool according to the first embodiment.

FIG. 7 is a schematic cross-sectional view showing a first step in the method of manufacturing a cutting tool according to the first embodiment. As shown in FIG. 7, in the step of covering the substrate with the diamond layer (S10: FIG. 6), substrate 20 is initially prepared. Substrate 20 is made, for example, of cemented carbide containing powders of tungsten carbide (WC) and a binder such as cobalt (Co). Substrate 20 is not limited to a substrate composed of cemented carbide but may be composed, for example, of cermet or ceramics. As shown in FIG. 7, substrate 20 mainly includes top surface 22 and side surface 21. Top surface 22 is opposed to a surface to be rake face 12 of cutting tool 100. Side surface 21 is opposed to a surface to be flank 11 of cutting tool 100.

Figure 8:
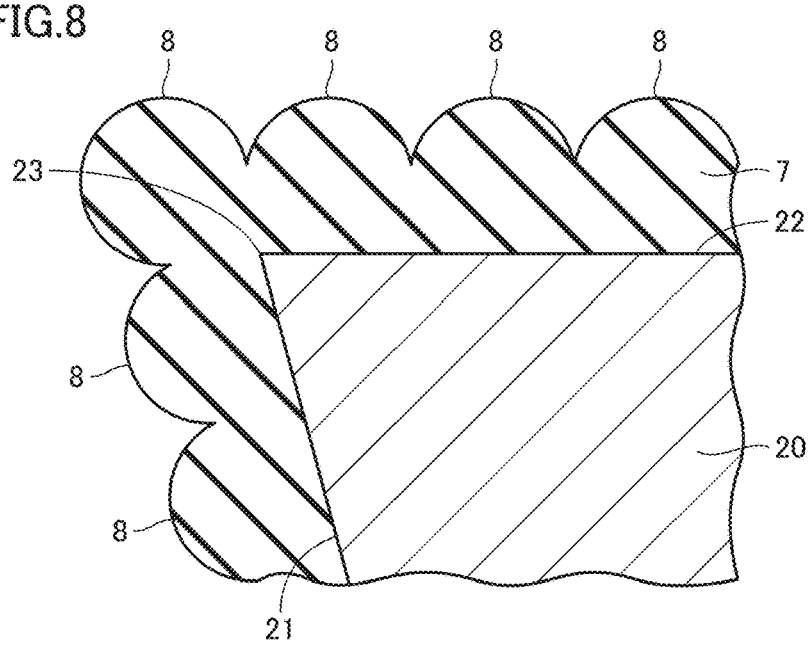
FIG. 8 is a schematic cross-sectional view showing a second step in the method of manufacturing a cutting tool according to the first embodiment.
Figure 9:
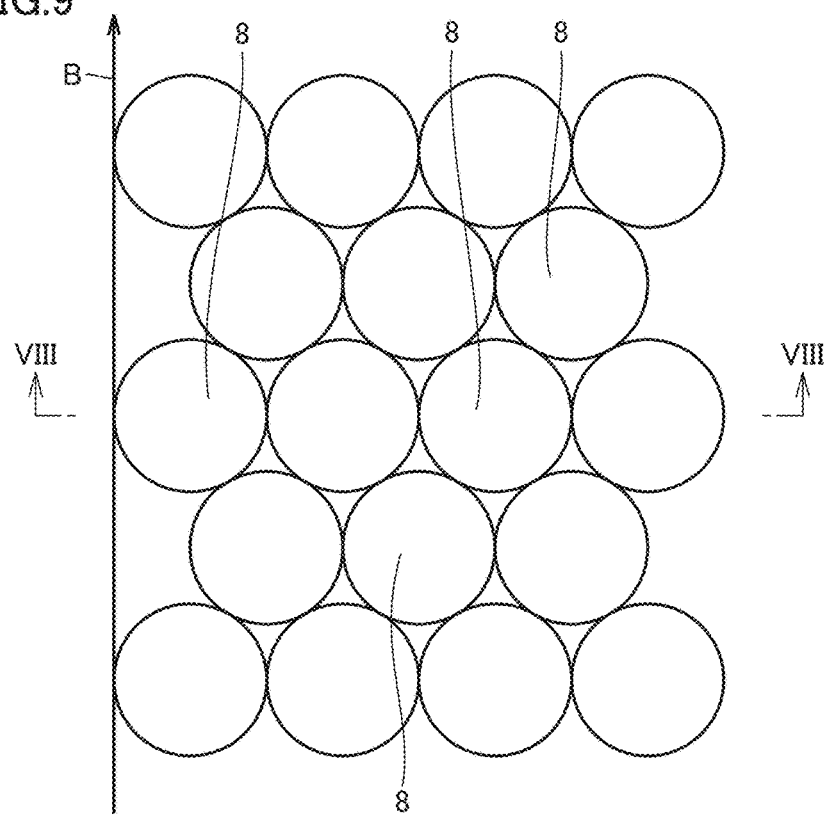
FIG. 9 is a schematic plan view showing the second step in the method of manufacturing a cutting tool according to the first embodiment.

FIG. 8 is a schematic cross-sectional view showing a second step in the method of manufacturing a cutting tool according to the first embodiment. FIG. 9 is a schematic plan view showing the second step in the method of manufacturing a cutting tool according to the first embodiment. As shown in FIGS. 8 and 9, substrate 20 is covered with diamond layer 7. Specifically, diamond layer 7 is formed, for example, by hot filament chemical vapor deposition (HFCVD). Diamond layer 7 has a thickness, for example, of approximately 10 μm. As shown in FIG. 8, diamond layer 7 is formed to cover top surface 22 and side surface 21. In the step of covering the substrate with diamond layer 7, the surface of diamond layer 7 is formed with a plurality of protrusions 8. Each of the plurality of protrusions 8 is, for example, hemispherical. Specifically, the surface of the portion of diamond layer 7 opposed to top surface 22 and the surface of the portion of diamond layer 7 opposed to side surface 21 are formed with the plurality of protrusions 8.

Then, the step of removing a part of the diamond layer by ion beams (S20: FIG. 6) is performed. Specifically, a part of diamond layer 7 is removed by emission of ion beams to the surface to be rake face 12 by using an ion etching apparatus. For example, oxygen ions are used for ion beams. By emitting oxygen ions to diamond layer 7, diamond layer 7 is converted to carbon monoxide or carbon dioxide. Diamond is thus vaporized and removed.

Figure 10:
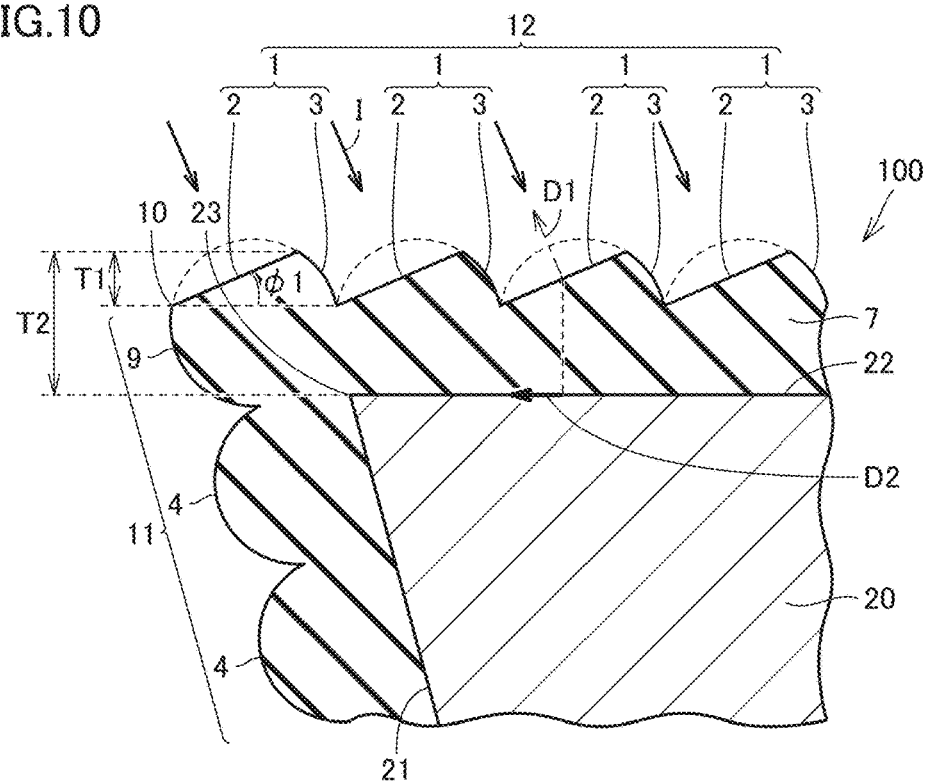
FIG. 10 is a schematic cross-sectional view showing a third step in the method of manufacturing a cutting tool according to the first embodiment.

FIG. 10 is a schematic cross-sectional view showing a third step in the method of manufacturing a cutting tool according to the first embodiment. Ion beams have directivity. As shown in FIG. 10, with top surface 22 facing up and ridgeline 23 between top surface 22 and side surface 21 facing to the left, ion beams are emitted from upper left in a direction inclined with respect to top surface 22. A part of each of the plurality of first protrusions 1 is thus removed. As shown in FIG. 10, when viewed in the cross-section perpendicular to direction of extension B of ridgeline 23, a direction of emission I of ion beams is inclined with respect to the normal to top surface 22. When viewed in the direction perpendicular to top surface 22, direction of emission I of ion beams may be substantially perpendicular to direction of extension B of ridgeline 23.

For example, EIS200-ER manufactured by Elionix Inc. can be employed as the ion etching apparatus. Conditions for ion etching include a time period of emission of ion beams for one hour and an applied voltage of 2500 V. When a diamond coating is generally removed by ion beams, the diamond coating is removed from substrate 20 while substrate 20 is turned around a revolution axis. In the method of manufacturing a cutting tool according to the present embodiment, however, the step of removing a part of the diamond layer is performed without turning substrate 20. In other words, a part of diamond layer 7 is removed while the substrate is held without varying the direction of emission of ion beams to top surface 22 of substrate 20. Rake face 12 including the plurality of first protrusions 1 is thus formed (see FIG. 4).

A function and effect of the cutting tool according to the first embodiment will now be described.

According to cutting tool 100 in the first embodiment, each of the plurality of first protrusions 1 includes first inclined portion 2 increasing in its height in the direction perpendicular to top surface 22 as a distance from cutting edge 10 increases. Therefore, chips can smoothly pass over first inclined portion 2 of rake face 12. Consequently, ejectability of chips is improved. Therefore, damage to the cutting tool is lessened and a tool lifetime can be improved.

According to cutting tool 100 in the first embodiment, when viewed in the direction perpendicular to top surface 22, angle θ formed between straight line D2 resulting from projection of normal D3 to first inclined portion 2 onto top surface 22 and normal D1 to cutting edge 10 in the direction in parallel to top surface 22 is not greater than 80°. A direction of ejection of chips can thus substantially be in parallel to the direction of straight line D2 resulting from projection of normal D3 to first inclined portion 2 onto top surface 22. Consequently, ejectability of chips is further improved.

According to cutting tool 100 in the first embodiment, when viewed in the direction perpendicular to top surface 22, the plurality of first protrusions 1 are provided over an area within 2 mm from cutting edge 10. Chips are thus readily ejected in a most part of the area where chips pass.

According to cutting tool 100 in the first embodiment, in the cross-section, cutting edge 10 has a radius of curvature not smaller than 0.01 μm and not greater than 50 μm. Sharpness can thus be improved.

According to the method of manufacturing cutting tool 100 in the first embodiment, a part of each of the plurality of protrusions 8 is removed by emission of ion beams from upper left in the direction inclined with respect to top surface 22 with top surface 22 facing up and the ridgeline between top surface 22 and side surface 21 facing to the left. The plurality of first protrusions 1 can thus be formed. Each of the plurality of first protrusions 1 includes first inclined portion 2 increasing in its height in the direction perpendicular to top surface 22 as a distance from cutting edge 10 increases. Therefore, chips can smoothly pass over first inclined portion 2 of rake face 12. Consequently, ejectability of chips is improved. Therefore, damage to the cutting tool is lessened and a tool lifetime is extended.

According to the method of manufacturing cutting tool 100 in the first embodiment, the step of removing a part of diamond layer 7 is performed without turning substrate 20. The plurality of first protrusions 1 can thus be formed with a simplified method.

Second Embodiment

A construction of cutting tool 100 according to a second embodiment will now be described. A feature different from that of cutting tool 100 according to the first embodiment will mainly be described below and similar description will not be repeated.

Figure 11:
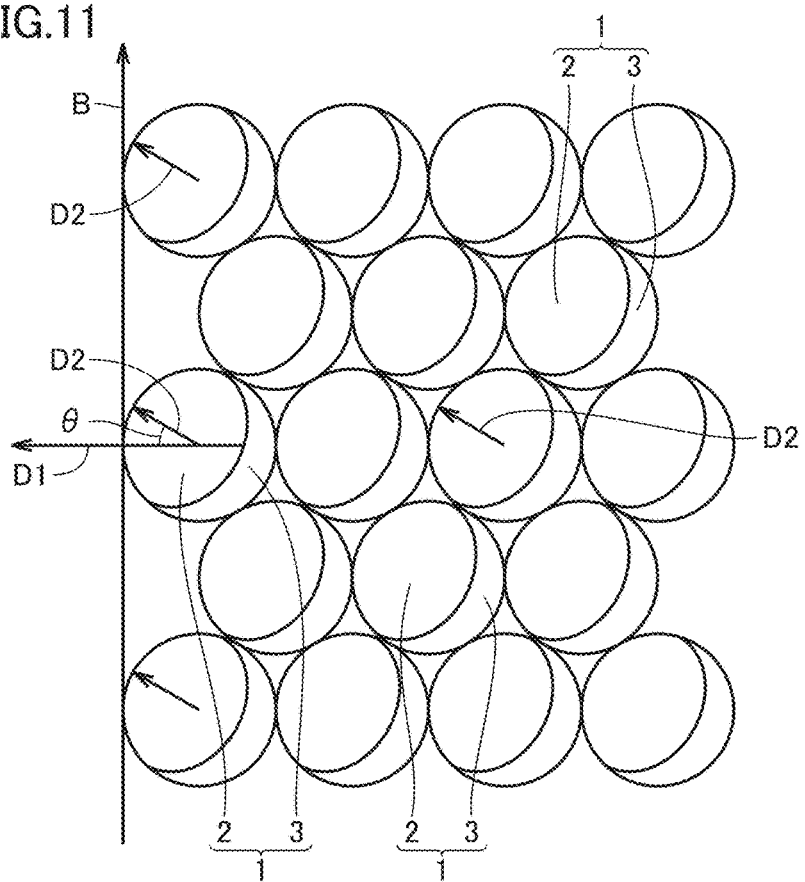
FIG. 11 is a schematic plan view showing a construction of a rake face 12 of the cutting tool according to a second embodiment.

FIG. 11 is a schematic plan view showing a construction of rake face 12 of the cutting tool according to the second embodiment. As shown in FIG. 11, when viewed in the direction perpendicular to top surface 22, straight line D2 resulting from projection of the normal to inclined portion 2 onto top surface 22 may be inclined with respect to normal D1 to cutting edge 10 in the direction in parallel to top surface 22. When viewed in the direction perpendicular to top surface 22, angle θ formed between straight line D2 resulting from projection of the normal to inclined portion 2 onto top surface 22 and normal D1 to cutting edge 10 in the direction in parallel to top surface 22 is, for example, not greater than 80°. Angle θ may be, for example, not greater than 60° or not greater than 30°. When viewed in the direction perpendicular to top surface 22, straight line D2 resulting from projection of the normal to inclined portion 2 onto top surface 22 may be inclined toward the shank with respect to normal D1 to cutting edge 10 in the direction in parallel to top surface 22 or toward a side opposite to the shank (a tip end side of the cutting tool).

The cutting tool according to the second embodiment can be formed by emission of ion beams with direction of emission I of ion beams being inclined with respect to normal D1 to direction of extension B of ridgeline 23 when viewed in the direction perpendicular to top surface 22 in the step of removing a part of diamond layer 7 by ion beams (S20: FIG. 6). The cutting tool according to the second embodiment can obtain an effect equivalent to that of the cutting tool according to the first embodiment.

Third Embodiment

A construction of cutting tool 100 according to a third embodiment will now be described. A feature different from that of cutting tool 100 according to the first embodiment will mainly be described below and similar description will not be repeated.

Figure 12:
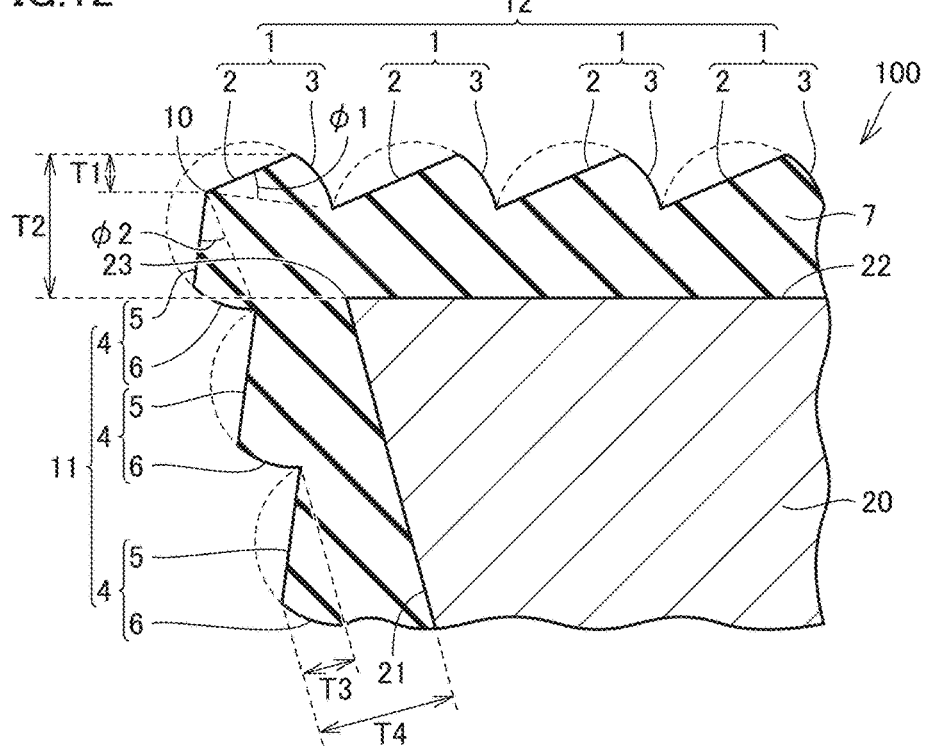
FIG. 12 is a schematic cross-sectional view showing a construction of the cutting tool according to a third embodiment.

FIG. 12 is a schematic cross-sectional view showing a construction of the cutting tool according to the third embodiment. When viewed in the direction perpendicular to side surface 21, flank 11 may include a plurality of second protrusions 4. The plurality of second protrusions 4 may be aligned in the direction perpendicular to direction of extension B of cutting edge 10. Similarly, the plurality of second protrusions 4 may be aligned along direction of extension B of cutting edge 10. The plurality of second protrusions 4 may be in contact with one another. Each of the plurality of second protrusions 4 may be in a shape like a scale. A large number of second protrusions 4 may be provided.

As shown in FIG. 12, in the cross-section perpendicular to direction of extension B of cutting edge 10, each of the plurality of second protrusions 4 includes a second inclined portion 5 and a second curvature portion 6. Second curvature portion 6 is continuous to second inclined portion 5. Each of the plurality of second protrusions 4 is constituted of second inclined portion 5 and second curvature portion 6. Second curvature portion 6 is located opposite to cutting edge 10 with respect to second inclined portion 5. Each of the plurality of second protrusions 4 protrudes in a direction away from substrate 20. In the cross-section, a height of second inclined portion 5 in the direction perpendicular to side surface 21 may increase as a distance from cutting edge 10 increases. The height of second inclined portion 5 may monotonously increase as the distance from cutting edge 10 increases. When arrangement is such that side surface 21 faces up and ridgeline 23 between top surface 22 and side surface 21 faces to the left, second inclined portion 5 may extend from lower left toward upper right.

Second inclined portion 5 is inclined with respect to side surface 21. An angle φ2 of second inclined portion 5 with respect to side surface 21 may be equal to or different from angle φ1 of first inclined portion 2 with respect to top surface 22. Thickness T4 of the portion of diamond layer 7 in contact with side surface 21 in the direction perpendicular to side surface 21 may be substantially equal to or different from thickness T2 of the portion of diamond layer 7 in contact with top surface 22 in the direction perpendicular to top surface 22. Thickness T3 of a second projection in the direction perpendicular to side surface 21 may be substantially equal to or different from thickness T1 of each of the plurality of first protrusions 1 in the direction perpendicular to top surface 22. As shown in FIG. 12, cutting edge 10 may be formed by a boundary between first inclined portion 2 of rake face 12 and second inclined portion 5 of flank 11. Cutting edge 10 can thus further sharply be formed.

The cutting tool according to the third embodiment can be formed by varying the direction of emission of ion beams to substrate 20 in the step of removing a part of diamond layer 7 by ion beams (S20: FIG. 6). Specifically, with top surface 22 facing up and ridgeline 23 between top surface 22 and side surface 21 facing to the left, ion beams are emitted from upper left in the direction inclined with respect to top surface 22. A part of each of the plurality of first protrusions 1 is thus removed. Similarly, with side surface 21 facing up and ridgeline 23 between top surface 22 and side surface 21 facing to the left, ion beams are emitted from upper left in the direction inclined with respect to side surface 21. A part of each of the plurality of second protrusions 4 is thus removed. According to the cutting tool in the third embodiment, wear of the flank can be suppressed.

Though an example where cutting tool 100 is a radius end mill is described in the first to third embodiments, cutting tool 100 is not limited to the radius end mill. Cutting tool 100 may be, for example, a rotary cutting tool such as a ball end mill or a drill.

EXAMPLE 1

Results of a cutting test using cutting tools of samples 1A to 1C will be described below. The cutting tools as samples 1A to 1C are initially prepared. Sample 1A is a cutting tool according to the first embodiment having a diameter of 12 mm (see FIG. 4).

Figure 13:
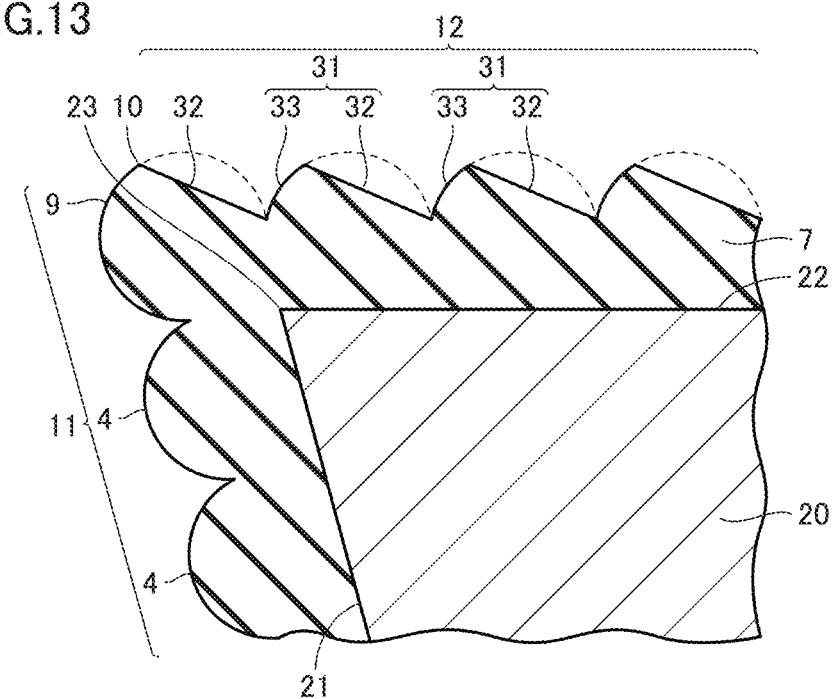
FIG. 13 is a schematic cross-sectional view showing a construction of a cutting tool of a sample 1B.

FIG. 13 is a schematic cross-sectional view showing a construction of the cutting tool as sample 1B. As shown in FIG. 13, rake face 12 of diamond layer 7 in the cutting tool of sample 1B includes a plurality of third protrusions 31. In the cross-section perpendicular to direction of extension B of cutting edge 10, each of the plurality of third protrusions 31 includes a third inclined portion 32 and a third curvature portion 33. Third curvature portion 33 is continuous to third inclined portion 32. Each of the plurality of third protrusions 31 is constituted of third inclined portion 32 and third curvature portion 33. Third curvature portion 33 is located opposite to cutting edge 10 with respect to third inclined portion 32. Each of the plurality of third protrusions 31 protrudes in a direction away from substrate 20.

In the cross-section, a height of third inclined portion 32 in the direction perpendicular to top surface 22 decreases as a distance from cutting edge 10 increases. The height of third inclined portion 32 monotonously decreases as the distance from cutting edge 10 increases. When arrangement is such that top surface 22 faces up and ridgeline 23 between top surface 22 and side surface 21 faces to the left, third inclined portion 32 extends from upper left toward lower right. The cutting tool of sample 1B is otherwise similar in construction to the cutting tool of sample 1A.

Figure 14:
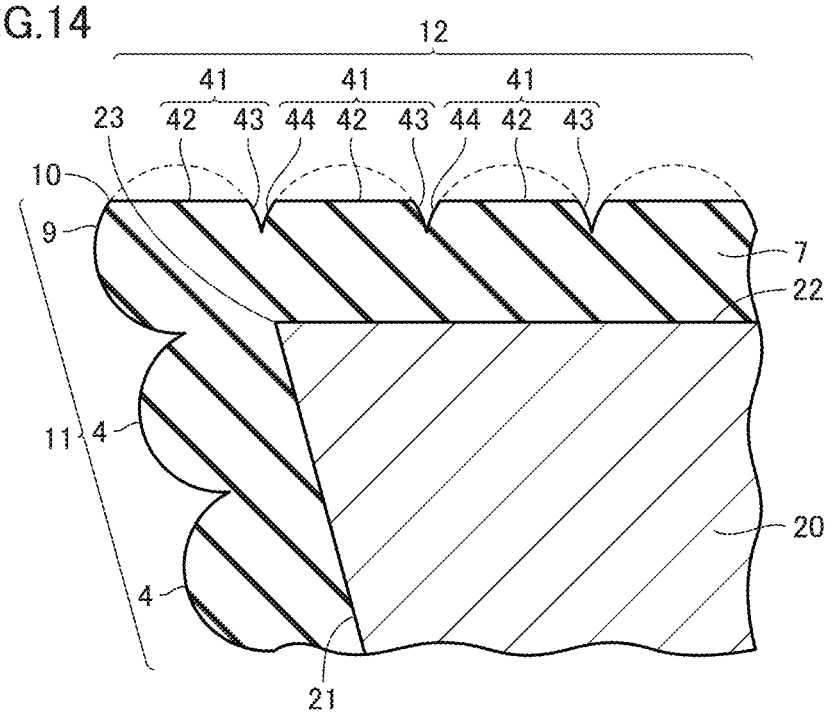
FIG. 14 is a schematic cross-sectional view showing a construction of a cutting tool of a sample 1C.

FIG. 14 is a schematic cross-sectional view showing a construction of the cutting tool as sample 1C. As shown in FIG. 14, rake face 12 of diamond layer 7 in the cutting tool of sample 1C includes a plurality of fourth protrusions 41. In the cross-section perpendicular to direction of extension B of cutting edge 10, each of the plurality of fourth protrusions 41 includes a flat portion 42, a fourth curvature portion

43, and a fifth curvature portion 44. Fourth curvature portion 43 is continuous to one end of flat portion 42. Fifth curvature portion 44 is continuous to the other end of flat portion 42.

Each of the plurality of fourth protrusions 41 is constituted of flat portion 42, fourth curvature portion 43, and fifth curvature portion 44. Fourth curvature portion 43 is located opposite to cutting edge 10 with respect to flat portion 42. Fifth curvature portion 44 is located on a side of cutting edge 10 with respect to flat portion 42. Flat portion 42 is located between fourth curvature portion 43 and fifth curvature portion 44. Each of the plurality of fourth protrusions 41 protrudes in the direction away from substrate 20.

In the cross-section, flat portion 42 is substantially in parallel to top surface 22. A height of fourth curvature portion 43 decreases as the distance from cutting edge 10 increases. A height of fifth curvature portion 44 increases as the distance form cutting edge 10 increases. The cutting tool of sample 1C is otherwise similar in construction to the cutting tool of sample 1A.

Conditions in the cutting test will now be described. A margin of CFRP having a thickness of 10 mm was cut by using these samples. Conditions for cutting include a cutting speed V=150 m/min., a feed rate f=0.48 mm/rev., and a total cutting length of 70 m. In an evaluation method, a size of wear in cutting edge 10 and rake face 12 of the tool after cutting by 70 m was checked. Table 1 shows results.

TABLE 1

| Sample Number | Cross-Sectional Shape of Cutting Tool | Amount of Wear of Rake Face (μm) |
| --- | --- | --- |
| 1A | FIG. 4 | 30 |
| 1B | FIG. 13 | 200 (Flaking) |
| 1C | FIG. 14 | 60 |

As shown in Table 1, amounts of wear of the rake faces of the cutting tools of samples 1A to 1C were 30 μm, 200 μm, and 60 μm, respectively. In the cutting tool of sample 1B, the diamond layer flaked away. The amount of wear of the rake face of the cutting tool of sample 1A was smallest. It was confirmed from the results above that the amount of wear of the rake face could be reduced by providing the inclined portion such that the height thereof in the direction perpendicular to the top surface increased as the distance from the cutting edge increased in the cross-section.

EXAMPLE 2

Results of a cutting test using cutting tools of samples 2A to 2C will be described below. The cutting tools as samples 2A to 2C are initially prepared. Samples 2A to 2C are cutting tools according to the second embodiment (see FIG. 11) and were fabricated such that angle θ thereof was set to angles shown in Table 2.

Conditions in the cutting test will now be described. These samples were evaluated under the conditions in the cutting test as in Example 1. Table 2 shows results.

TABLE 2

| Sample Number | Angle θ (°) | Amount of Wear of Rake Face (μm) |
| --- | --- | --- |
| 2A | 0 | 24 |
| 2B | 30 | 32 |
| 2C | 80 | 40 |

As shown in Table 2, amounts of wear of the rake faces of the cutting tools of samples 2A to 2C were 24 μm, 32 μm, and 40 μm, respectively. The amount of wear of the rake face was smaller as angle θ was smaller. It was confirmed that the amount of wear of the rake face was within an allowable range when angle θ was equal to or smaller than 80°.

EXAMPLE 3

Results of a cutting test using cutting tools of samples 3A to 3C will be described below. The cutting tools as samples 3A to 3C are initially prepared. Samples 3A to 3C are cutting tools according to the first embodiment (see FIG. 4) and were fabricated such that distance L from the cutting edge was set as shown in Table 3.

Conditions in the cutting test will now be described. These samples were evaluated under the conditions in the cutting test as in Example 1. Table 3 shows results.

TABLE 3

| Sample Number | Distance L (μm) From Cutting Edge | Amount of Wear of Rake Face (μm) |
| --- | --- | --- |
| 3A | 1500 | 29 |
| 3B | 500 | 32 |
| 3C | 10 | 35 |

As shown in Table 3, amounts of wear of the rake faces of the cutting tools of samples 3A to 3C were 29 μm, 32 μm, and 35 μm, respectively. The amount of wear of the rake face was smaller as distance L from the cutting edge was longer. It was confirmed that the amount of wear of the rake face was within an allowable range when the protrusions were provided over an area within 10 μm from the cutting edge.

EXAMPLE 4

Results of a cutting test using cutting tools of samples 4A to 4E will be described below. The cutting tools as samples 4A to 4E are initially prepared. Samples 4A to 4E are cutting tools according to the first embodiment (see FIG. 4) and were fabricated such that the radius of curvature of the cutting edge was as shown in Table 4.

Conditions in the cutting test will now be described. These samples were evaluated under the conditions in the cutting test as in Example 1. Table 4 shows results.

TABLE 4

| Sample Number | Radius of Curvature of Cutting Edge (μm) | Amount of Wear of Rake Face (μm) | Amount of Wear of Flank (μm) |
| --- | --- | --- | --- |
| 4A | 0.005 | 40 | 40 |
| 4B | 0.01 | 24 | 27 |
| 4C | 5 | 22 | 26 |
| 4D | 50 | 35 | 35 |
| 4E | 60 | 45 | 45 |

As shown in Table 4, amounts of wear of the rake faces of the cutting tools of samples 4A to 4E were 40 μm, 24 μm, 22 μm, 35 μm, and 45 μm, respectively. Amounts of wear of the flanks of the cutting tools of samples 4A to 4E were 40 μm, 27 μm, 26 μm, 35 μm, and 45 μm, respectively. It was confirmed from the results above that the amount of wear of the rake face and the amount of wear of the flank were small within the range of the radius of curvature of the cutting edge not smaller than 0.01 μm and not greater than 50 μm.

It should be understood that the embodiments and the examples disclosed herein are illustrative and non-restrictive in every respect. The scope of the present invention is defined by the terms of the claims rather than the description above and is intended to include any modifications within the scope and meaning equivalent to the terms of the claims.

REFERENCE SIGNS LIST 1 protrusion (first protrusion); 2 inclined portion (first inclined portion); 2a second outer peripheral portion; 3 curvature portion (first curvature portion); 3a boundary portion; 3b first outer peripheral portion; 4 second protrusion; 5 second inclined portion; 6 second curvature portion; 7 diamond layer; 10 cutting edge; 10a end cutting edge; 10b peripheral cutting edge; 11 flank; 11a first flank portion; 11b second flank portion; 12 rake face; 12a first rake face portion; 12b second rake face portion; 14 heel face; 15 first flute face; 17 second flute face; 19 shank; 20 substrate; 21 side surface; 22 top surface; 23 ridgeline; 31 third protrusion; 32 third inclined portion; 33 third curvature portion; 41 fourth protrusion; 42 flat portion; 43 fourth curvature portion; 44 fifth curvature portion; 100 cutting tool; A central axis; B direction of extension; D1 normal to cutting edge; D2 straight line; D3 normal to inclined portion; I direction of emission; L distance; T1, T2, T3, T4 thickness; W1, W2, W3, W4 width

The invention claimed is:

1. A cutting tool comprising:
   a substrate; and
   a diamond layer that covers the substrate, wherein
   the diamond layer including a rake face and a flank continuous to the rake face,
   a ridgeline between the rake face and the flank forming a cutting edge,
   the substrate including a top surface opposed to the rake face,
   when viewed in a direction perpendicular to the top surface, the rake face including a plurality of protrusions,
   in a cross-section perpendicular to a direction of extension of the cutting edge, each of the plurality of protrusions including an inclined portion and a curvature portion continuous to the inclined portion,
   in the cross-section, a height of the inclined portion in the direction perpendicular to the top surface increasing as a distance from the cutting edge increases, and
   in the cross-section, each of the plurality of protrusions has a height not smaller than 1 μm.

2. The cutting tool according to claim 1, wherein
   when viewed in the direction perpendicular to the top surface, an angle formed between a straight line resulting from projection of a normal to the inclined portion onto the top surface and a normal to the cutting edge in a direction in parallel to the top surface is not greater than 80°.

3. The cutting tool according to claim 1, wherein
   when viewed in the direction perpendicular to the top surface, the plurality of protrusions are provided over an area within 2 mm from the cutting edge.

4. The cutting tool according to claim 1, wherein
   in the cross-section, the cutting edge has a radius of curvature not smaller than 0.01 μm and not greater than 50 μm.

5. The cutting tool according to claim 1, wherein
   the substrate includes a side surface opposed to the flank, and
   a thickness of a portion of the diamond layer in contact with the side surface in a direction perpendicular to the side surface is greater than a thickness of a portion of the diamond layer in contact with the top surface in the direction perpendicular to the top surface.

* * * * *